United States Patent

Hazelton

[11] Patent Number: 6,144,119
[45] Date of Patent: Nov. 7, 2000

[54] PLANAR ELECTRIC MOTOR WITH DUAL COIL AND MAGNET ARRAYS

[75] Inventor: Andrew J. Hazelton, San Carlos, Calif.

[73] Assignee: Nikon Corporation, Tokyo, Japan

[21] Appl. No.: 09/335,638

[22] Filed: Jun. 18, 1999

[51] Int. Cl.$^7$ .................... H02K 41/00; H01L 21/00
[52] U.S. Cl. ...................... 310/12; 74/471 XY
[58] Field of Search .................. 310/12; 29/760, 29/721, 785; 33/1 M; 108/137, 138; 355/53, 72; 248/913

[56] References Cited

U.S. PATENT DOCUMENTS

| | | | |
|---|---|---|---|
| 3,851,196 | 11/1974 | Hinds | 310/12 |
| 4,555,650 | 11/1985 | Asakawa | 318/135 |
| 4,654,571 | 3/1987 | Hinds | 318/687 |
| 5,153,494 | 10/1992 | Hollis, Jr. | 318/640 |
| 5,196,745 | 3/1993 | Trumper | 310/12 |
| 5,334,892 | 8/1994 | Chitayat | 310/12 |
| 5,528,118 | 6/1996 | Lee | 318/568.17 |
| 5,623,853 | 4/1997 | Novak et al. | 74/490.09 |
| 5,715,037 | 2/1998 | Saiki et al. | 250/548 X |
| 5,773,837 | 6/1998 | Nakasuji | 250/398 X |

*Primary Examiner*—Nestor Ramirez
*Assistant Examiner*—Judson H. Jones
*Attorney, Agent, or Firm*—Morrison & Foerster LLP

[57] ABSTRACT

An electric motor comprising a first motor portion having a first magnet array and a first coil array positioned adjacent to the first magnet array and operable to interact with magnetic fields of the first magnet array to move a member, and a second motor portion comprising a second magnet array and a second coil array positioned adjacent to the second magnet array and operable to interact with magnetic fields of the second magnet array to move the member. The first motor portion and the second motor portion are generally parallel to one another and configured for receiving the member therebetween. The motor may be used to position a stage in an exposure apparatus. A method of positioning an object with the motor is also disclosed.

46 Claims, 12 Drawing Sheets

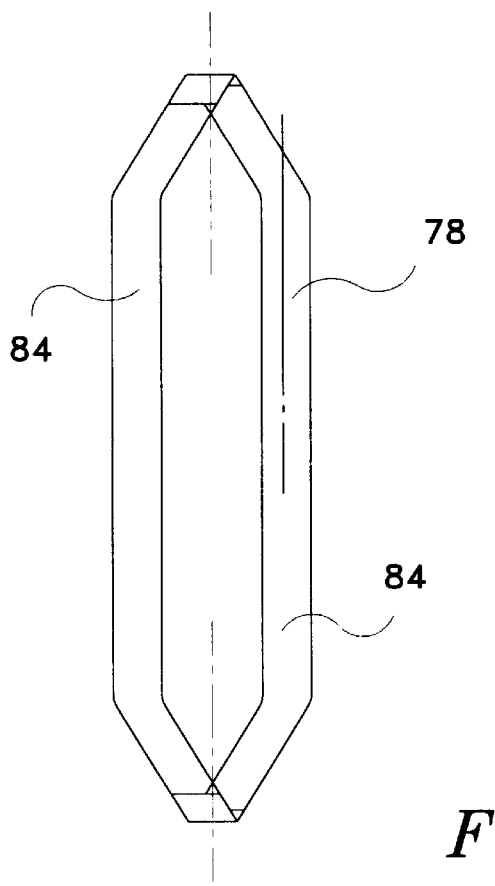
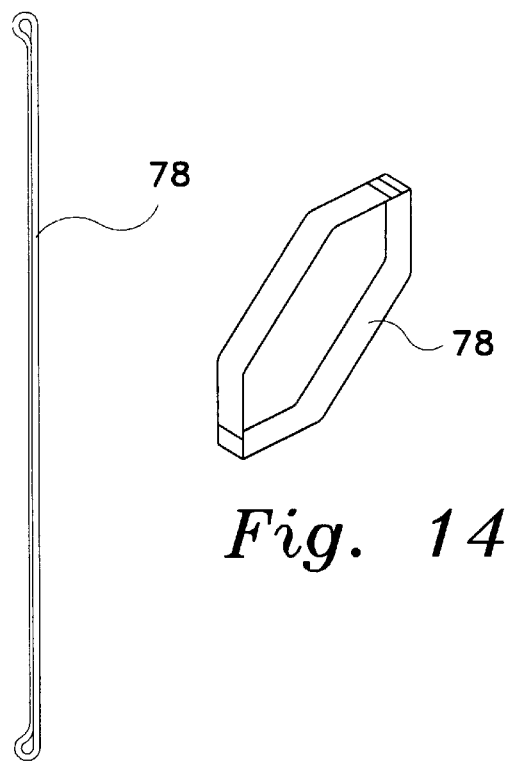
*Fig. 14*
*Fig. 13*
*Fig. 12*
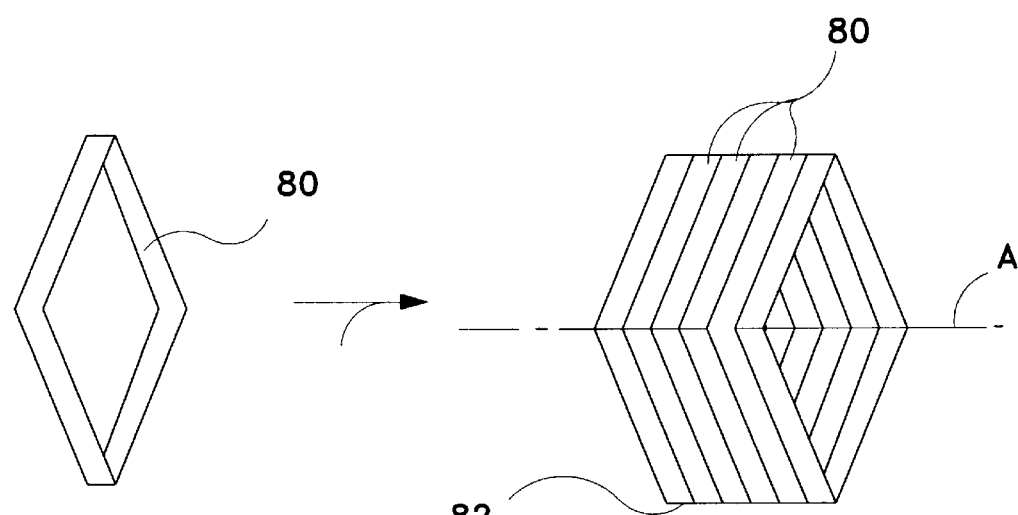
*Fig. 15*
*Fig. 16*

PLANAR ELECTRIC MOTOR WITH DUAL COIL AND MAGNET ARRAYS

FIELD OF THE INVENTION

This invention relates generally to electric motors, and more particularly, to high precision motors for use in lithography systems.

BACKGROUND OF THE INVENTION

Many precision systems, such as those used in semiconductor manufacturing, use linear or planar motors for positioning objects such as semiconductor wafers. Conventional planar motors are disclosed in U.S. Pat. Nos. 3,851,196, 4,654,571, 5,196,745, and 5,334,892. These patents describe planar motors that have significant limitations. For example, the planar motor of the '196 patent has limited range of motion since each motor portion of the stationary magnet array can only generate force in a single direction. Thus, each coil array must always be located above the corresponding magnet array. This limits the range of movement for a given size actuator. The motor disclosed in the '745 patent similarly requires each coil array to be located above a corresponding linear magnet array. The motor of the '571 patent includes a coil design which generates only a limited amount of force due to the layout of the coils on the stage. In addition, the design does not generate force in six degrees of freedom. The '892 patent discloses a planar motor which permits a wide range of motion, but only in a single plane.

Conventional technology also relies upon cumbersome stacked arrangements to achieve six degrees of freedom of movement. These stacked arrangements have a number of drawbacks including additional power requirements, and reduced positioning accuracy. Motors which eliminate stacked arrangements and provide six degree of freedoms over a full range of movement of the wafer stage with a single planar motor require large magnet and coil arrays to provide the force required. This results in an increase in mass of the stage and system, thus reducing the natural frequency of the system and degrading performance.

There is, therefore, a need for a compact motor which provides six degrees of freedom with high speed and precision and energy efficient operation.

SUMMARY OF THE INVENTION

The present invention overcomes the deficiencies of the prior art by providing a planar electric motor with two motor portions positioned on opposite sides of a member for moving the member. Each motor portion has a magnet array and coil array and can be independently driven or driven in conjunction with the other motor portion to move the member. The dual magnet and coil arrays reduce the overall power required by the motor and allow for more efficient six degree movement of the member than conventional motors. Moreover, this arrangement allows the member to be supported at a nominal position between the two motor portions with minimal or no power consumption.

An electric motor of the present invention generally comprises a first motor portion having a first magnet array and a first coil array positioned adjacent to the first magnet array and operable to interact with magnetic fields of the first magnet array to move a member, and a second motor portion having a second magnet array and a second coil array positioned adjacent to the second magnet array and operable to interact with magnetic fields of the second magnet array to move the member. The first motor portion and the second motor portion are generally parallel to one another and configured for receiving the member therebetween.

In one embodiment, the first magnet array is a planar magnet array and the first coil array is a planar coil array. The second magnet array comprises a plurality of linear magnet arrays and the second coil array comprises a plurality of linear coil arrays.

In another aspect of the invention, a positioning device generally comprises a frame, a member movable relative to the frame, and an electric motor. The member has a first surface and a second surface generally parallel to one another. The electric motor comprises a first motor portion having a first magnet array and a first coil array, and a second motor portion having a second magnet array and a second coil array. The first coil array and the second coil array are fixedly attached to the frame. The first magnet array is connected to the first surface of the member and the second magnet array is connected to the second surface of the member. The member is interposed between the first and second motor portions with the first coil array being positioned adjacent to the first magnet array to interact with magnetic fields of the first magnet array, and the second coil array is positioned adjacent to the second magnet array to interact with magnetic fields of the second magnet array to move the member relative to the first and second coil arrays.

In yet another aspect of the invention an exposure apparatus generally comprises an optical system for imaging a pattern onto an article and a stage device for positioning the article relative to the optical system for imaging. The stage device comprises a stage movable relative to the optical system and having a lower surface and an upper surface adapted for supporting the article. The stage device further comprises a first motor portion having a first magnet array and a first coil array and a second motor portion having a second magnet array and a second coil array. One of the first magnet array and the first coil array is attached to one of the surfaces of the stage and one of the second magnet array and the second coil array is attached to the other surface of the stage. The stage is interposed between the first and second motor portions with the first coil array being positioned adjacent to the first magnet array to interact with magnetic fields of the first magnet array and the second coil array being positioned adjacent to the second magnet array to interact with magnetic fields of the second magnet array to move the stage.

A method of the present invention for positioning an object generally comprises: providing the first and second motor portions and member; attaching one of the first magnet and coil arrays to one of the surfaces of the member; attaching one of the second magnet and coil arrays to the other surface of the member; and applying one or more currents to one or more coils of the first coil array to interact with magnetic fields of the first magnet array to generate a force between the first coil array and the first magnet array, and to one or more coils of the second coil array to generate a force between the second coil array and the second magnet array to move the object.

The above is a brief description of some deficiencies in the prior art and advantages of the present invention. Other features, advantages, and embodiments of the invention will be apparent to those skilled in the art from the following description, drawings, and claims.

BRIEF DESCRIPTION OF THE DRAWINGS

FIG. 12 is a plan view of a coil of the second coil array of FIG. 10;

FIG. 13 is a side view of the coil of FIG. 12;

FIG. 14 is a perspective of the coil of FIG. 12;

FIG. 15 is a plan view of an alternative embodiment of the coil of FIG. 12;

FIG. 16 is a plan view of a row of the coils of FIG. 15;

Corresponding reference characters indicate corresponding parts throughout the several views of the drawings.

DESCRIPTION OF THE INVENTION

Figure 1:
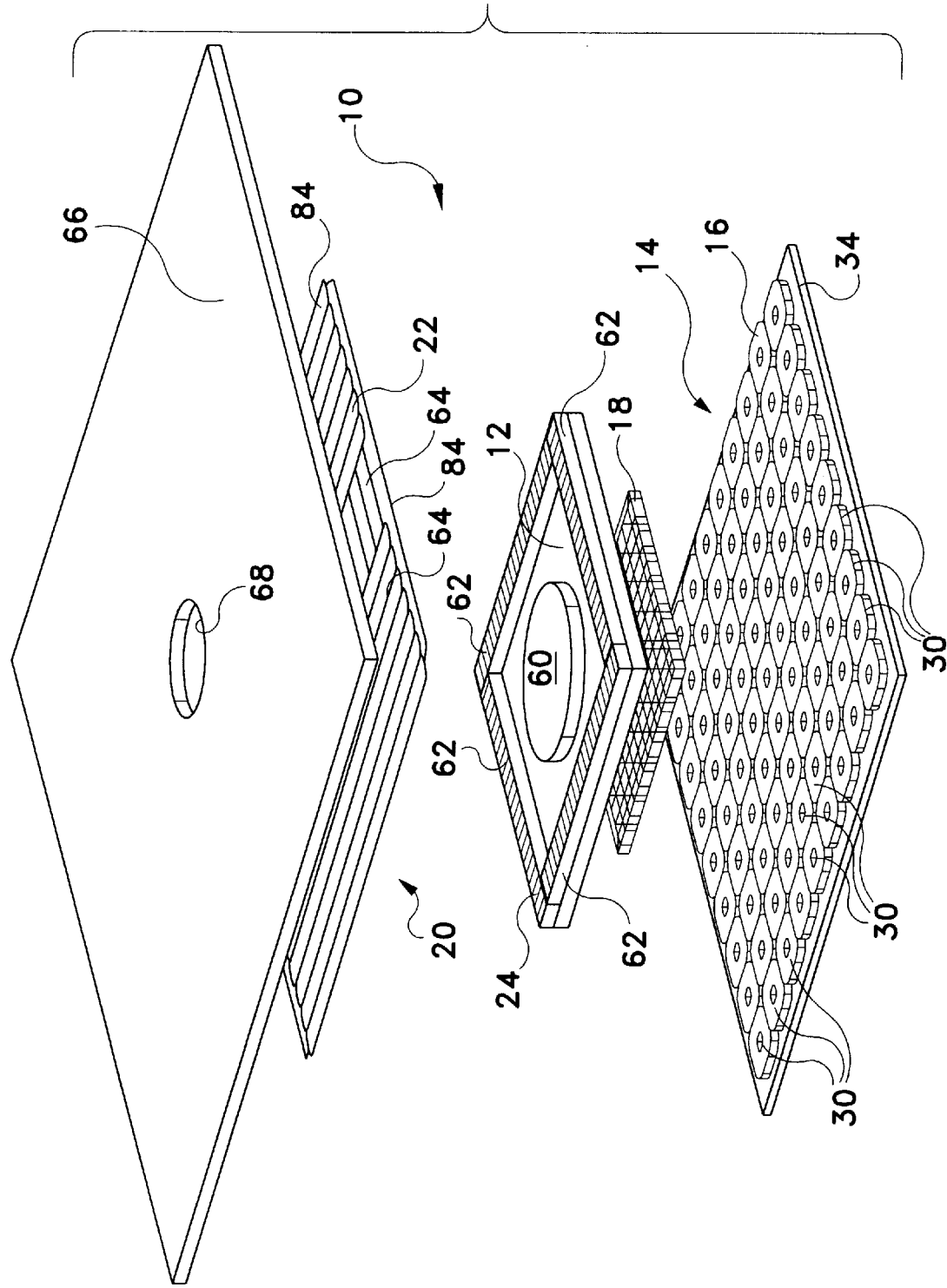
FIG. 1 is an exploded view of an electric motor of the present invention.
Figure 2:
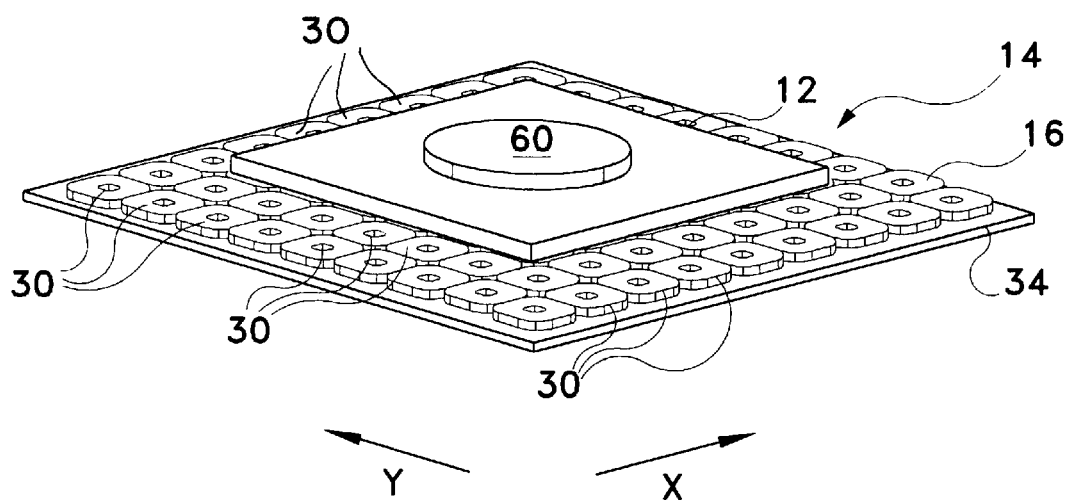
FIG. 2 is a perspective of a stage and a first portion of the motor of FIG. 1.

Referring now to the drawings, and first to FIG. 1, an electric motor of the present invention is generally indicated at 10. The motor 10 is for use in semiconductor processing, and more specifically photolithography systems. The electric motor 10 positions a stage (member) 12 which is used to support a semiconductor wafer during the photolithography process. The motor uses electromagnetic force (Lorentz force) to propel a moving part such as the stage. The motor comprises a first motor portion, generally indicated at 14, (FIG. 2) disposed on one side of the stage and having a first coil array 16 and a first magnet array 18, and a second motor portion, generally indicated at 20 (FIG. 3) located on an opposite side of the stage 12 and having a second coil array 22 and a second magnet array 24. Each magnet array 18, 24 provides permanent magnetic fields and each coil array 16, 22 provides a current distribution (FIG. 1). The current distribution of the coil array 16, 22 interacts with the permanent magnetic field of the magnet array 18, 24 to cause a force between the magnet array and the coil array. The interaction of the magnetic field and the current distribution permits either the magnet array 18, 24 or the coil array 16, 22 to move with respect to the other in at least three degrees of movement and preferably six degrees of freedom.

Preferably, currents in the coil array 16, 22 interact with magnetic fields from the magnet array 18, 24 to cause force in the X, Y, and Z directions, and torque about the X, Y, and Z directions between the coil array and the magnet array. This interaction, and the general operation of a planar motor is described in U.S. Pat. application Ser. Nos. 09/192,813, by A. Hazelton et al., filed, Nov. 16, 1998, and 09/135,624, by A. Hazelton, filed Aug. 17, 1998, the entirety of which are incorporated herein by reference.

As shown in FIG. 1, the magnet arrays 18, 24 are each attached to the stage 12 and are free to move with the stage relative to the coil arrays 16, 22 which are in a stationary position. This moving magnet embodiment is preferred over a moving coil arrangement when used in positioning devices, because the magnet arrays 18, 24 do not require electrical current connections. In addition, when coil cooling is required, cooling hoses must be attached to the coil arrays 16, 22. The electrical connections and cooling hoses may interfere with movement of a coil array. However, the coil arrays 16, 22 may be attached to the stage 12 and movable relative to fixed magnet arrays for other applications.

Figure 4:
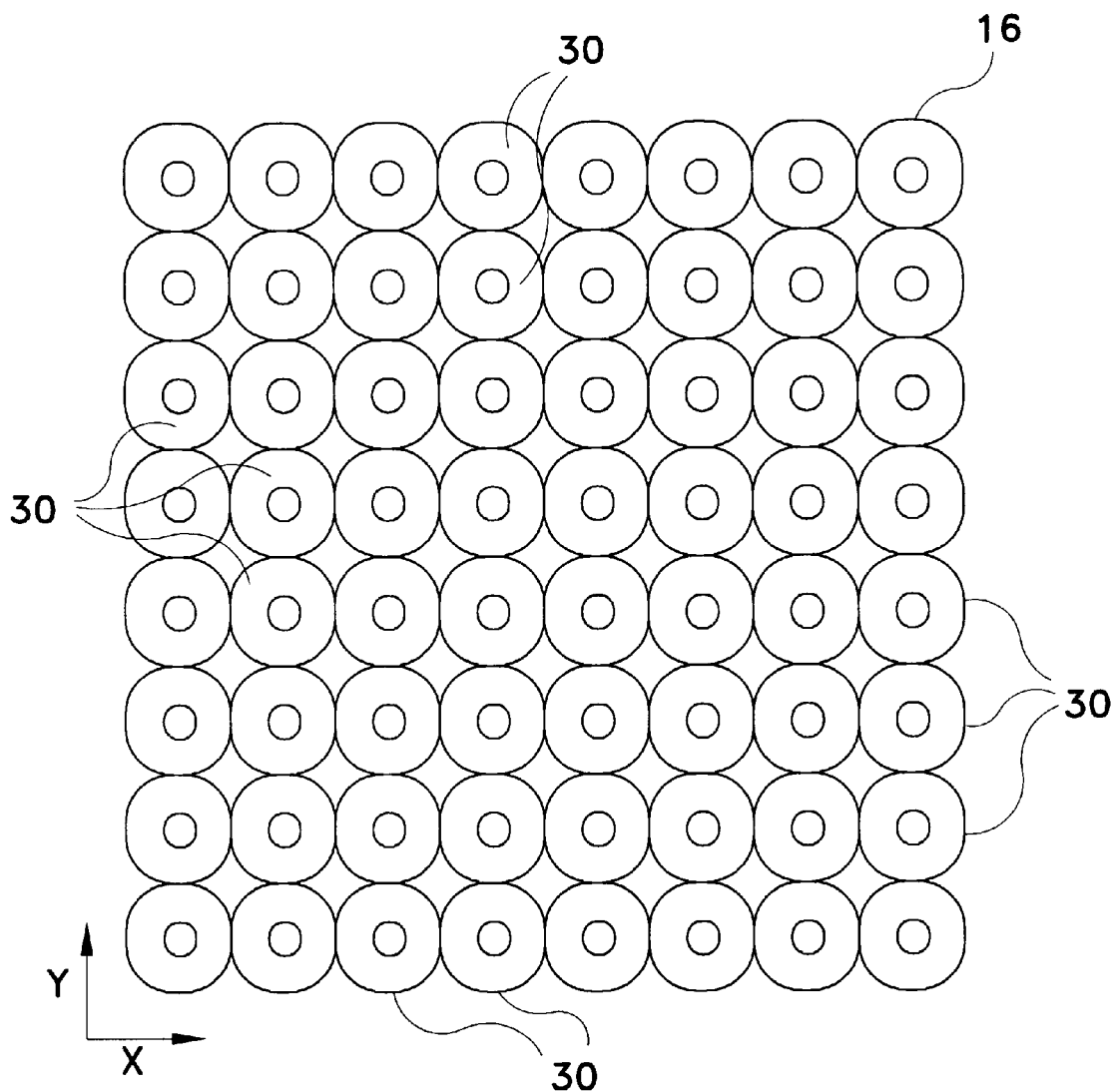
FIG. 4 is a plan view of a first coil array of the motor of FIG. 1.

The first coil array 16 includes a plurality of coils 30 periodically distributed in two directions (X and Y) and arranged in a rectangular pattern (FIG. 4). Preferably, the coils 30 all have the same shape and are evenly spaced in the X and Y directions.

However, it is to be understood that the coils 30 may have different shapes, sizes, or arrangements than the one shown herein without departing from the scope of the invention. The coils 30 may have a toroidal shape as shown in FIG. 4, or an oval shape, for example. The coil array 16 is mounted on a backing panel (bottom plate) 34 which comprises a magnetically permeable material, such as iron, or a magnetically impermeable material. The magnetically permeable backing panel 34 increases the permanent magnetic flux through the coils 30 and thus increases coil performance.

Figure 5:
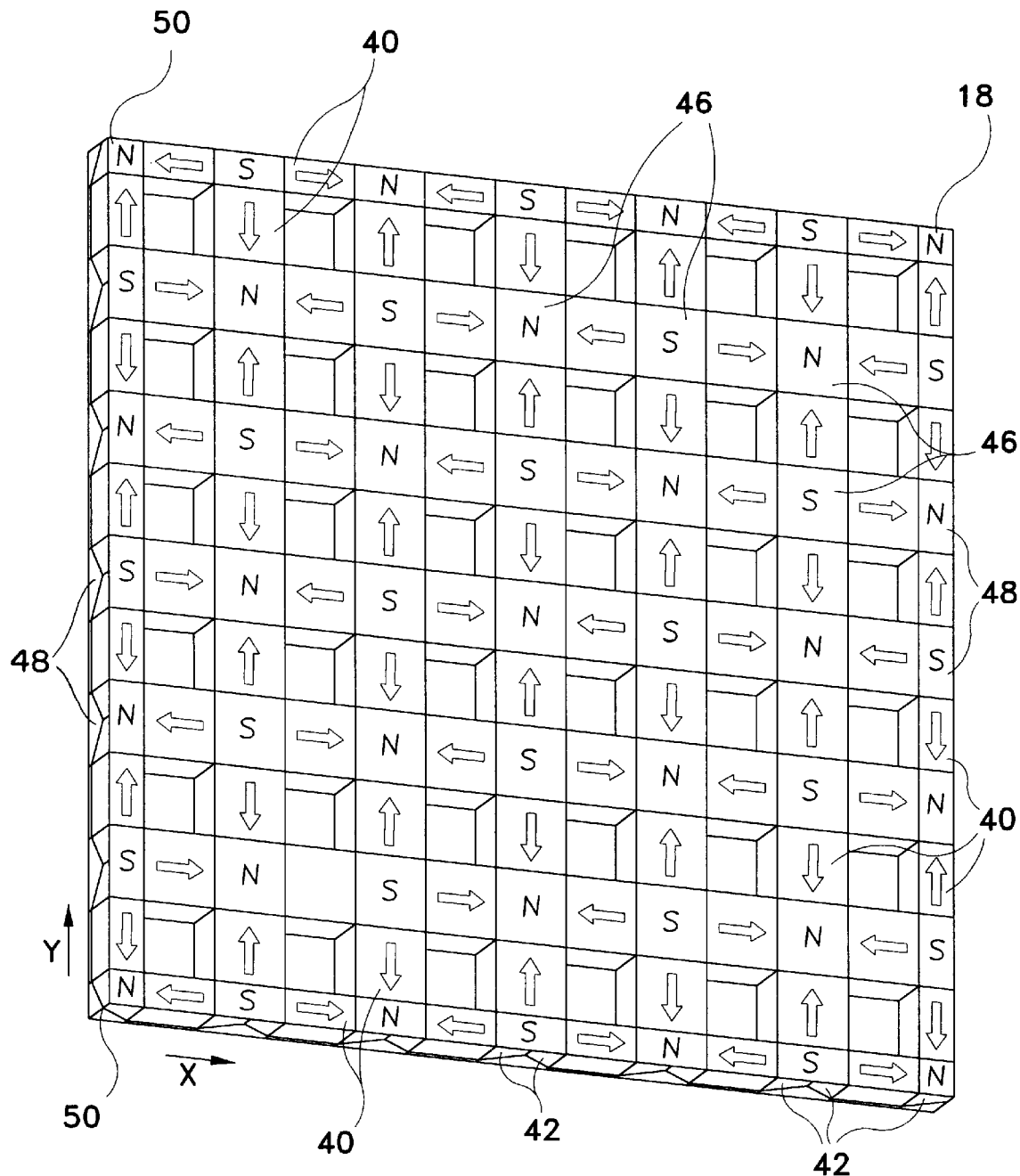
FIG. 5 is a schematic of a first magnet array of the motor of FIG. 1.
Figure 6:
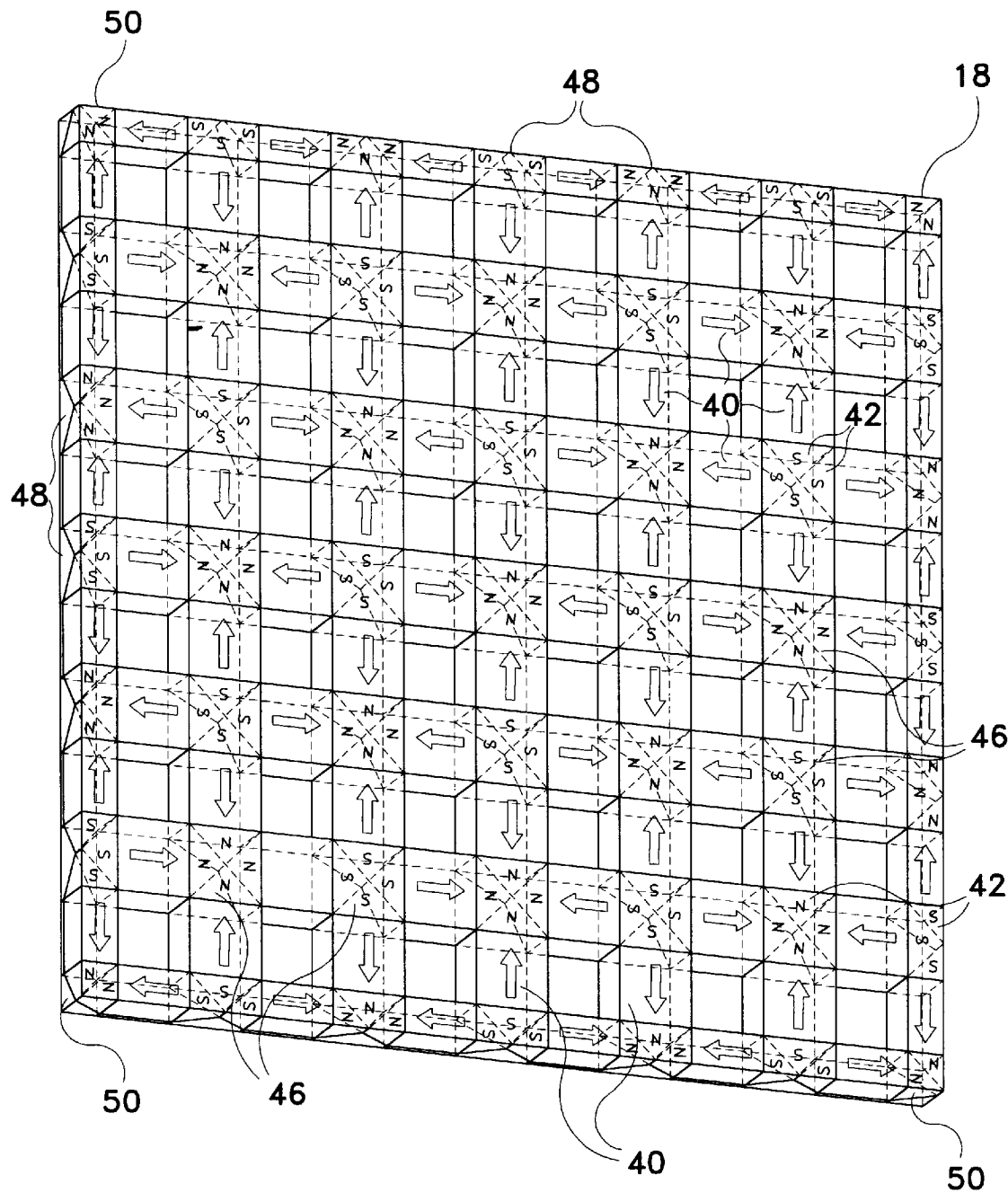
FIG. 6 diagrammatically illustrates the arrangement of wedge and transverse magnets in the first magnet array of FIG. 5.
Figure 7:
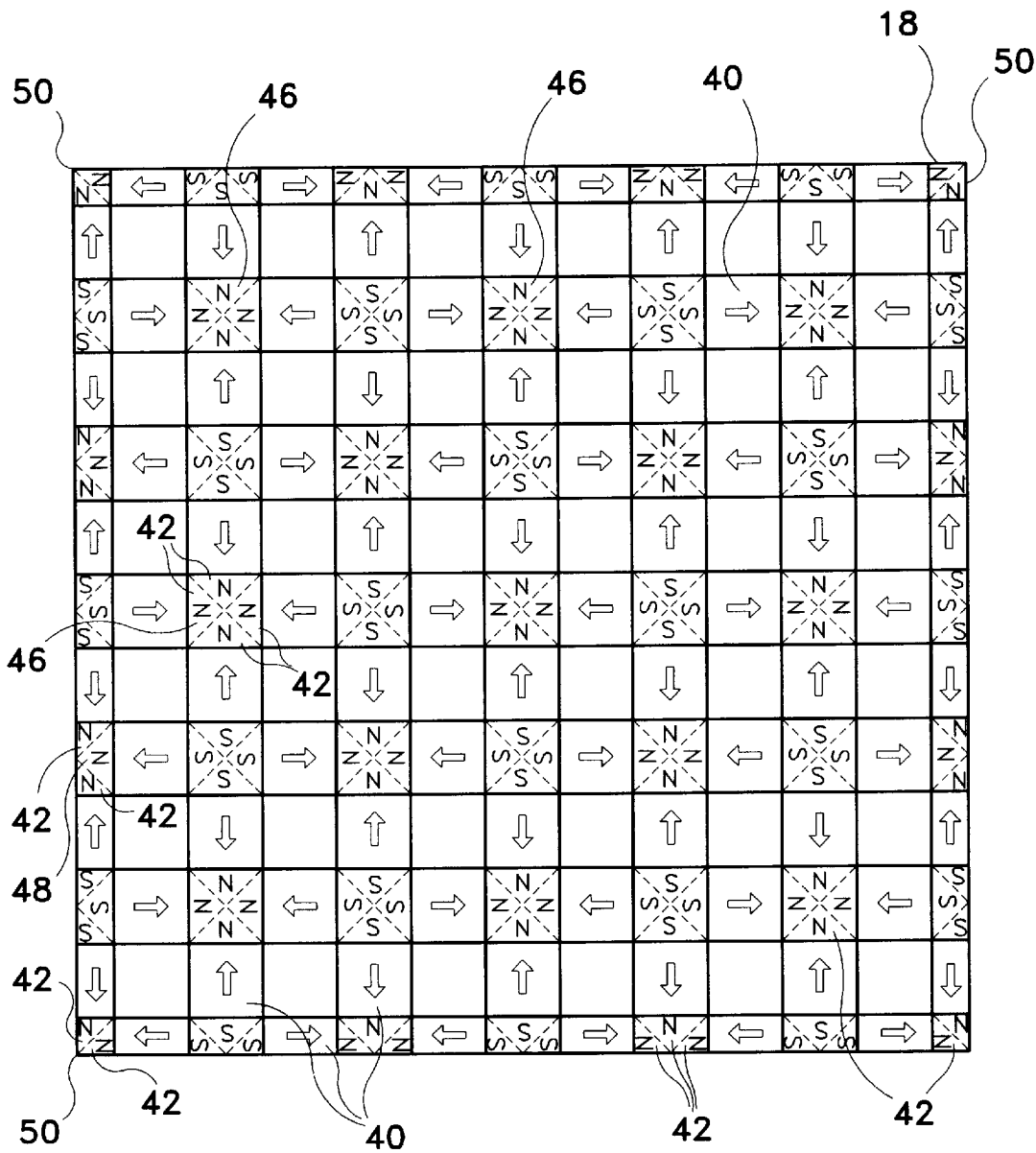
FIG. 7 is a plan view of the first magnet array of FIG. 5 further showing the arrangement of the wedge magnets.
Figure 8:
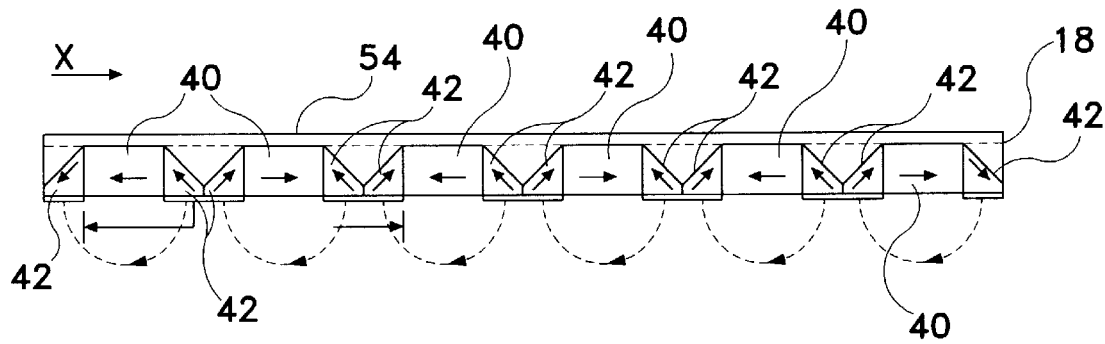
FIG. 8 is a side view of the first magnet array of FIG. 5.

The first magnet array 18 includes a plurality of magnets 40, 42 distributed in a first direction along an X axis and in a second direction along an Y axis to form a two-dimensional magnet array (FIGS. 5–7). The magnet array 18 is described in U.S. patent application Ser. No. 09/168,694, by Hazelton et al., filed on Oct. 5, 1998, which is incorporated herein in its entirety by reference. The magnets are either transverse magnets 40 or wedge magnets 42. Generally, a wedge magnet 42 is any permanent magnet having its polarization or magnetization direction at a non-zero, non-perpendicular angle with respect to a portion of its surface (FIG. 8). Perpendicular angles are defined as 90 degrees plus or minus multiples of 180 degrees. Each wedge magnet 42 in the magnet set has a polarization at an acute angle (i.e., greater than zero degrees and less than ninety degrees with respect to a reference plane defined by the X axis and the Y axis). The wedge magnets 42 may have a high residual flux greater than 12,000 Gauss, for example.

A plurality (e.g., two, three, or four) of wedge magnets 42 are arranged together to form a wedge magnet set (FIGS. 6 and 7). Interior wedge magnet sets 46 include four wedge magnets 42, exterior edge magnet sets 48 include three wedge magnets, and exterior corner wedge magnet sets 50 include two wedge magnets. The interior magnet sets 46 have approximately equal fluxes and alternate in polarity. The exterior edge magnet sets 48 have half the flux of each interior magnet set 46 and corner magnet sets 50 have one-quarter the magnetic flux of each interior magnet set. The transverse magnets 40 have polarities parallel to the surface defined by the X and Y axes and are placed between wedge magnet sets to complete flux paths (FIG. 8). With the wedge magnets 42 arranged as shown in FIG. 8, their respective magnetic fluxes combine to form a resultant magnetic flux in a direction perpendicular to the X and Y axes. The combination of the wedge magnets 42 in the magnet sets and the transverse magnets 40 results in a significant increase in magnetic flux in directions perpendicular to the X and Y axes. Completion of the flux path in this way provides for a higher flux-to-mass ratio for the magnet array 18 without the need for heavy magnetically permeable backings.

The polarities of the transverse and wedge magnets 40, 42 are shown by arrows on the magnets in FIG. 8. Wedge magnets 42 in the interior wedge magnet sets 46 have identical shapes. Their polarities are at approximately a 45 degree angle with respect to the X axis. The wedge magnets 42 in the corner magnet set 50 have similar relationships; the polarization of the wedge magnet is at approximately a 45 degree angle with respect to the X axis. The magnets 40, 42 are mounted on a backing panel 54 which is preferably a magnetically impermeable material. The backing panel 54 is attached to a lower surface of the stage 12. Alternatively, the magnets 40, 42 may be attached directly to the stage 12.

It is to be understood that the first motor portion 14, first coil array 16, or first magnet array 18 may be different than those shown herein without departing from the scope of the invention. For example, the magnet array 18 may include a plurality of magnets having alternating polarities extending along only one axis, as described in U.S. patent application Ser. No. 09/192,813, referenced above. The coil array 16 may include a plurality of hexagonal coils as described in U.S. patent application Ser. No. 09/168,694, referenced above.

Figure 3:
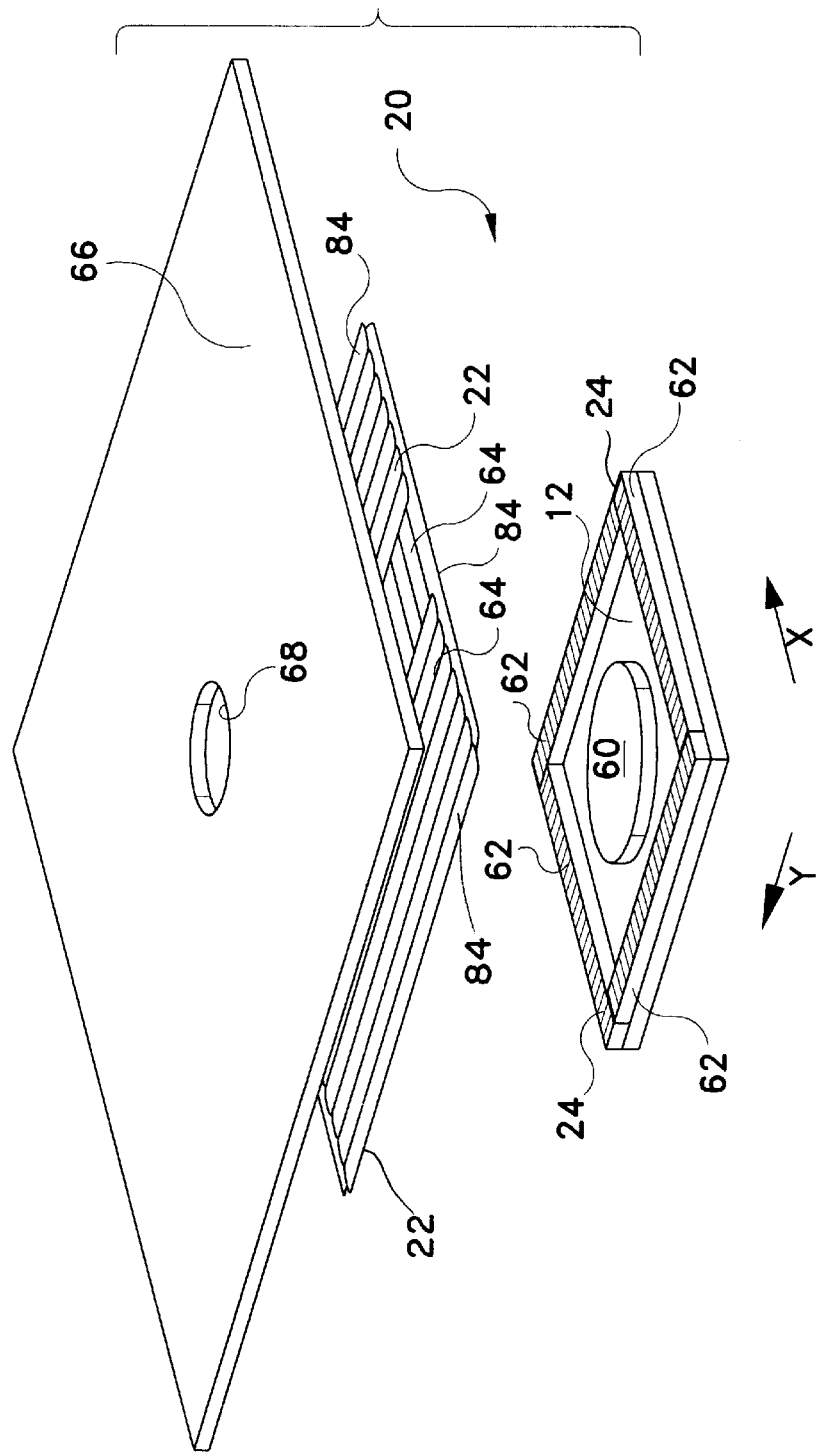
FIG. 3 is a perspective of the stage and a second portion of the motor of FIG. 1.

The second portion 20 of the motor 10 is located on the opposite side of the stage 12 than the first portion 14 of the motor (FIG. 1). The second magnet array 24 is mounted on a peripheral edge margin of an upper surface of the stage 12 (FIG. 3). The magnet array 24 surrounds a wafer chuck 60 which is positioned in the center of the stage 12 for holding a semiconductor wafer or other article. Attached to the upper surface of the stage 12 are four linear magnet arrays 62 (FIG. 3). Two linear magnet arrays 62 are aligned in the X direction and two are aligned in the Y direction. Positioned directly above the linear magnet arrays 62 are four sets of linear coil arrays 64, two aligned in the X direction and two aligned in the Y direction. The linear coil arrays 64 are attached to a backing plate (not shown) which may or may not be magnetic. Currents in the coil array 22 interact with magnetic fields from the magnet array 24 to cause force in the X, Y, and Z directions, and torque about the X, Y, and Z directions between the coil array and the magnet array. This interaction, and the general operation of a hex coil planar motor are described in U.S. patent application Ser. No. 09/135,624, by A. Hazelton, filed Aug. 17, 1998. A top plate 66 supports the coil array 22 and includes an opening 68 for the light from the optical system to pass through and expose the surface of the semiconductor wafer.

Figure 9:
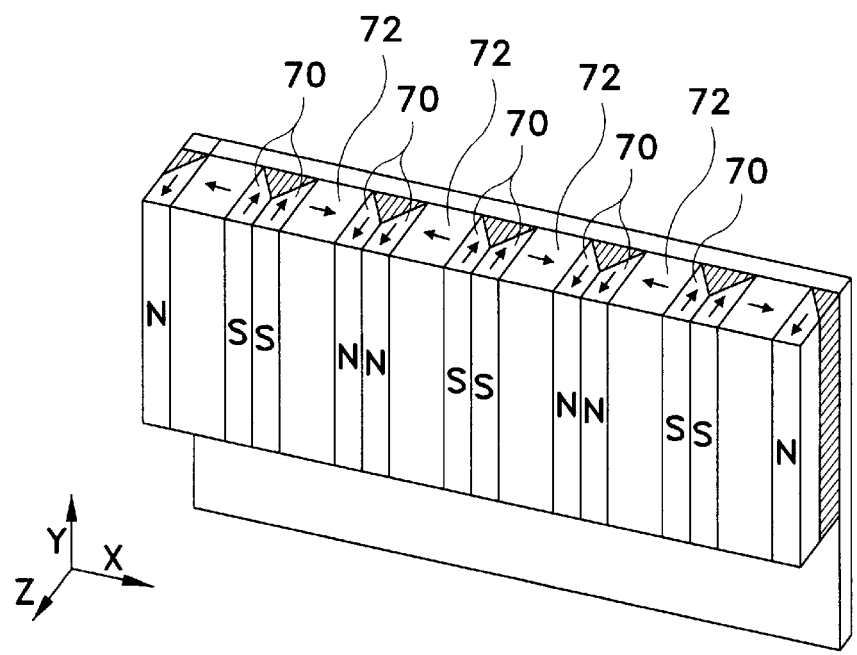
FIG. 9 is a perspective of a portion of a second magnet array of the electric motor of FIG. 1.
Figure 10:
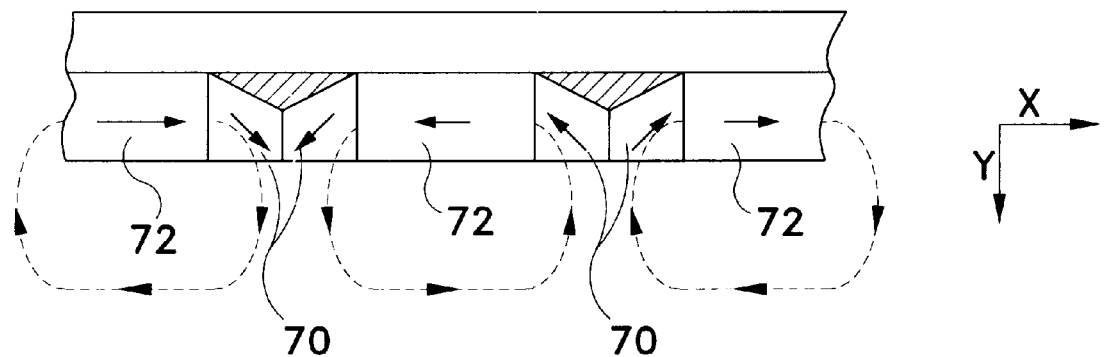
FIG. 10 is a fragmentary plan view of the second magnet array of FIG. 9.
Figure 11:
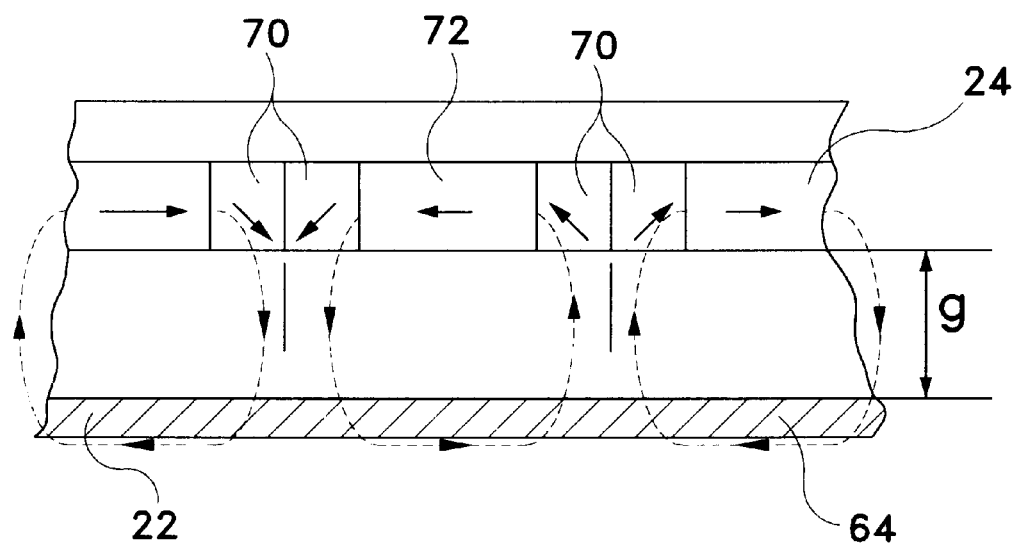
FIG. 11 is a fragmentary plan view of the second magnet array and a second coil array of the electric motor of FIG. 1.

Each linear magnet array 62 comprises a plurality of wedge magnets 70 and transverse magnets 72 (FIGS. 9 and 10). Transverse magnets 72 have alternately reversed magnetic polarities which are oriented generally parallel to the X axis. Each transverse magnet 72 is interposed between two wedge magnets 70. As illustrated in FIG. 9, the wedge magnets 70 have internal magnetic polarities oriented intermediate between the magnetic polarity of their respective adjacent transverse magnets 72. The z-direction magnetic polarity component of the wedge magnets 70 creates an array of north and south magnet poles on the wedge magnet faces. The wedge magnets 70 may be configured as trapezoidal prisms, as illustrated in FIGS. 9 and 10, or may have a rectangular cross-section, as shown in FIG. 11, for example. The broken lines in FIG. 10 trace the magnetic flux paths. A magnet set, defined by a transverse magnet 72 and its two adjacent wedge magnets 70, is linked by a closed magnetic flux circuit.

FIG. 11 is a plan view of a portion of the second magnet array 24 and the second coil array 22 which is separated from the magnet array by a gap g. In operation, the motor couples the coil array 22 with the magnet array 24. The motor 10 is energized by applying electric current to the coil array 22, thereby generating an electromagnetic force on the coil array in cooperation with the magnet array 24. The electromagnetic force moves the magnet array 24 relative to the coil array 22.

The second coil array 22 and coils 78, 80 of the array are shown in (FIGS. 3 and 12–18). An apparatus and method for making this coil are described in U.S. patent application Ser. No. 09/059,056, by Hazelton et al., filed Apr. 10, 1998, and incorporated herein by reference. The second coil array 22 comprises four linear coil arrays 64 each having a plurality of hexagonal shaped coils 78 (FIGS. 12–14). The coil may have shapes other than hexagonal, including diamond 80 (as shown in FIGS. 15–18), double diamond, and parallelogram, for example.

Figure 18:
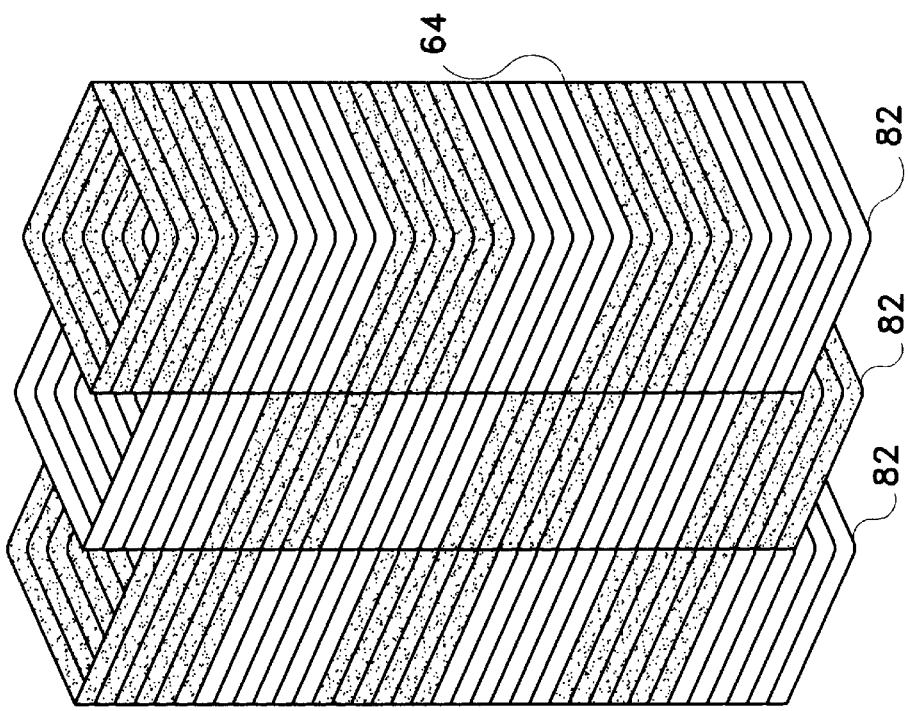
FIG. 18 is an alternative arrangement of the coils of FIG. 15.
Figure 17:
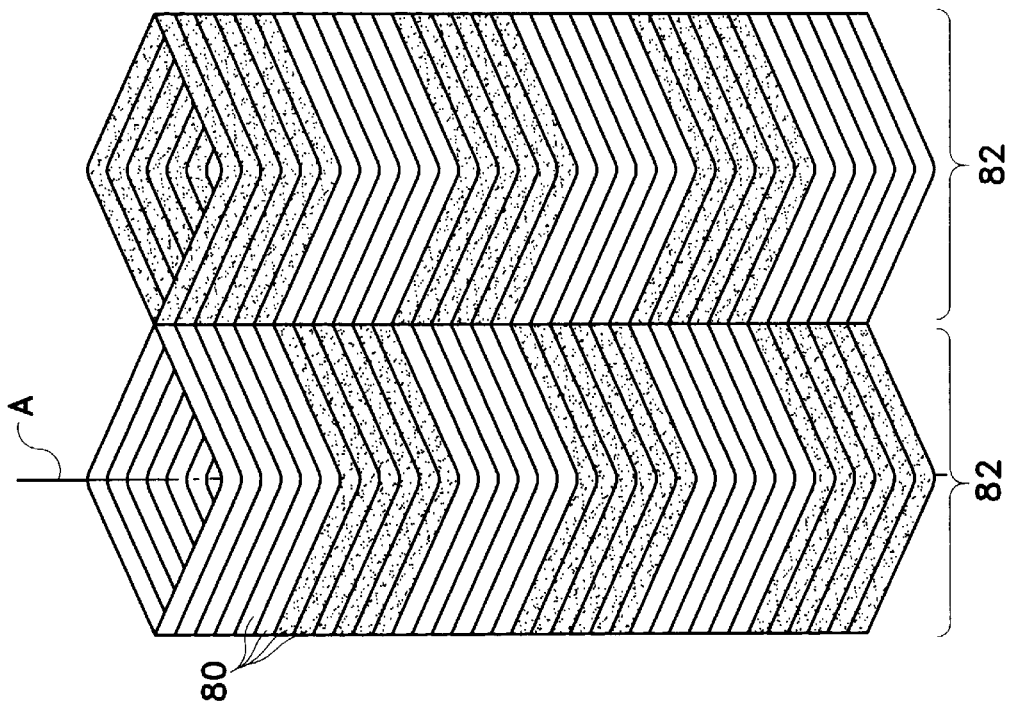
FIG. 17 is an array of the coils of FIG. 15.

In order to construct a linear coil array 64, a row 82 of partially overlapped coils is first assembled parallel to a longitudinal axis A, as shown in FIG. 16. The row 82 includes six coils 80, two coils for each of three phases. The number of coils 80 in a row 82 may vary, depending on the number of phases of the motor and the choice of coils per phase. Each phase of one row 82 is driven by a separate amplifier of a commutation circuit (not shown). Each linear coil array 64 includes a plurality of rows 82. FIG. 17 shows one arrangement of rows 82. The rows 82 of coils 80 are arranged side-by-side in a lateral direction non-collinear with the longitudinal axis A. Preferably coil assemblies are arranged side-by-side in a direction orthogonal to the longitudinal axis A. FIG. 18 shows another type of arrangement of rows 82. Three coil rows 82 are overlapped side-by-side to form a laterally overlapped linear coil array 64. The coil row 82 should be as long as the required travel of the stage 12 plus the length of the stage.

As shown in FIG. 3, the linear coil arrays 64 are arranged to form an opening in the coil array 22 so that the optical system can pass through and expose the surface of a semiconductor wafer. The coils 78 are arranged in an x-layer for movement of the stage in the x-direction and a y-layer for movement of the stage in the y-direction. For example, coils 78 which are arranged to provide y-direction propulsion, have legs 84 oriented principally perpendicular to the y-direction. Similarly, coils arranged to provide x-direction propulsion, have legs 84 oriented principally perpendicular to the x-direction. In operation, each coil produces substantially constant force along a respective x or y linear direction. It is to be understood that the shape of the coils, the number of coils in a row, the number of rows, and arrangement of rows may be different than those shown herein without departing from the scope of the invention.

The top and bottom plates 66, 34 are preferably both made of a magnetically permeable material such as silicon steel so that the gap between the second magnet array 24 and the top plate, and between the first magnet array 18 and the bottom plate can be adjusted such that the sum of the forces due to the second magnet array attraction, the first magnet array attraction, and the weight of the stage 12 is zero at its nominal operating position. This results in no current, and consequently no power being required to support the stage 12 at its nominal position.

Since the first and second motor portions 14, 20 are each capable of providing six degrees of movement between the stage 12 and the top or bottom plate 66, 34, there are a number of options for driving the stage. The preferred method for driving the stage 12 is to use the second motor portion 20 to drive the stage in six degrees of freedom, while the first motor portion 14 is only used to provide force in the X and Y directions, thus simplifying control of the entire system. It is to be understood however, that control arrangements other than the one described herein can be used without departing from the scope of the invention. For example, both motor portions 14, 20 can be used to drive the stage 12 in six degrees of movement, or one motor portion can drive the stage in three degrees and the other motor can drive the stage in the other three degrees of movement.

Furthermore, other types and arrangements of the coil arrays and magnet arrays may be used without departing from the scope of the invention. For example, the magnet arrays 18, 22 may be attached to the fixed portion of the stage 12 and the coil arrays 16, 22 attached to the moving portion of the stage in one or both of the motor portions 14, 20. Also, the first motor portion 14 and second motor portion 20 may be switched so that the first motor portion is above the stage 12 and the second motor portion is below the stage. Either the first or second motor portions 14, 20 may also be used on both sides of the stage, for example. The motor 10 described herein may also be used to drive a reticle stage.

Also, a bearing system may be used to provide one or more of the degrees of movement instead of having one or both motor portions 14, 20 control all six degrees of movement. Either the first motor portion 14, the second motor portion 20, or both motor portions may include an air bearing separating the coil array 16, 22 and the magnet array 18, 24. When an air bearing separates the coil array 16, 22 and the magnet array 18, 24, the coil array or the magnet array may be potted with any suitable material, such as with epoxy, or covered by a flat plate made of, for example, ceramic, composite or metal, to form essentially flat surfaces. The essentially flat surfaces improve performance of the air bearing in separating or levitating the coil array and magnet array relative to one another.

Figure 19:
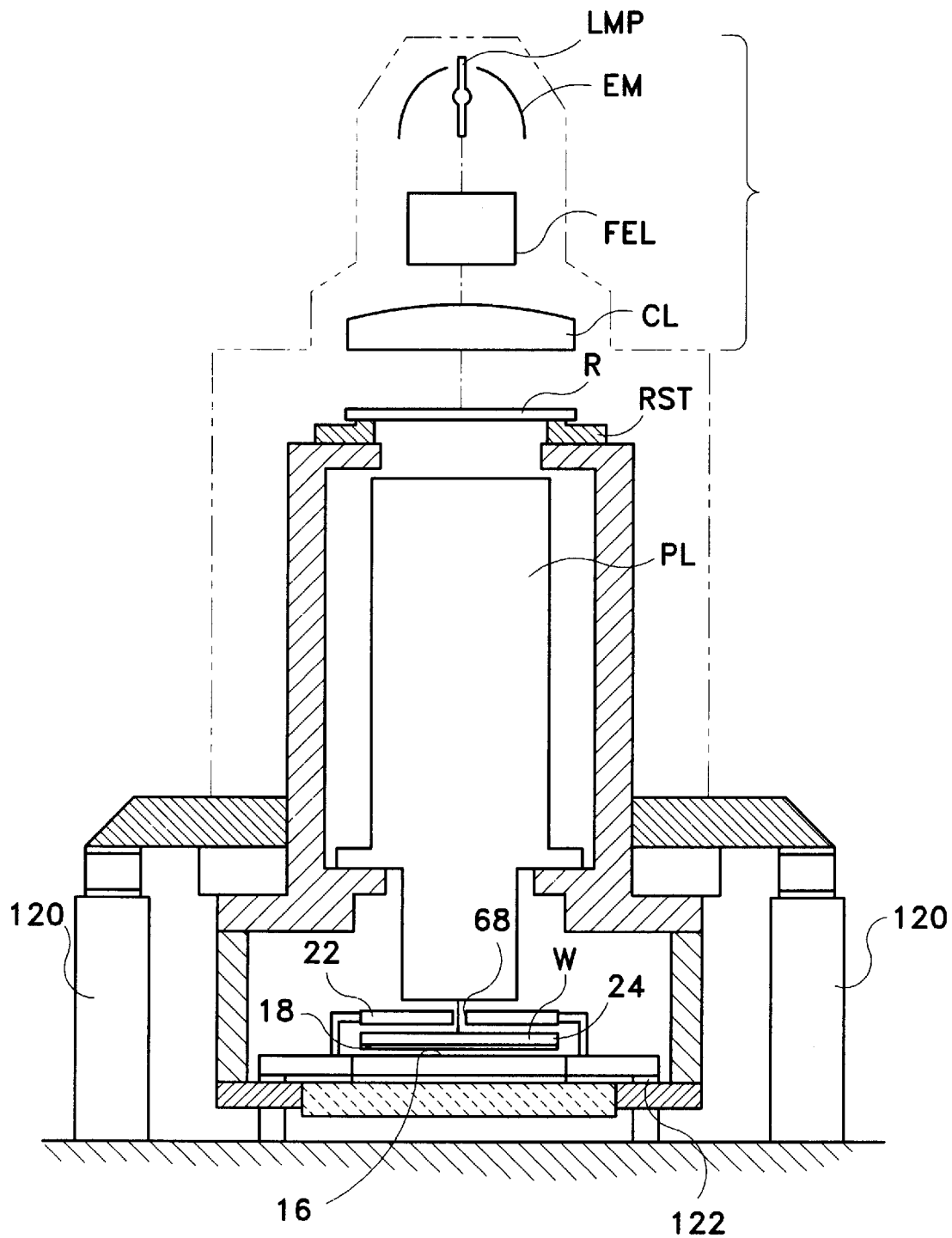
FIG. 19 is a schematic of a photolithography system with the electric motor of FIG. 1.

FIG. 19 schematically illustrates an example of a lithography system 100 using the planar motor of the present invention. Examples of photolithography instruments that may incorporate the motor of the present invention are described in U.S. Pat. Nos. 5,528,118, 5,623,853, 5,773,837, 5,715,037, and 5,528,118, all of which are incorporated herein by reference. The lithography system 100 generally comprises an illumination system and the motor 10, and stage 12 for wafer W support and positioning. The illumination system projects light through a mask pattern (e.g., a circuit pattern for a semiconductor device on a reticle (mask) R which is supported by and scanned using a stage. The light exposes the mask pattern on a layer of photoresist on the wafer W. The optical system includes an illuminator having a lamp LMP and an ellipsoid mirror EM surrounding the lamp. The illuminator comprises an optical integrator FEL producing secondary light source images and a condenser lens CL for illuminating the mask R with uniform light flux. A mask holder RST for holding the mask R is mounted above a lens barrel PL on a part of a column assembly which is supported on a plurality of rigid arms 120. The wafer W is shown supported on a support plate (upper surface of the stage 12). The first and second magnet arrays 18, 24 are attached to the stage and the first and second coil arrays 16, 22 are attached to a frame 122. It is to be understood that the lithography system may be different than the one shown herein without departing from the scope of the invention.

The photolithography system 100 shown in FIG. 19 may be a scanning photolithography system, wherein a mask pattern is exposed while the mask and a wafer are moved synchronously, or a step-and-repeat photolithography system, wherein a mask pattern is exposed while the mask and a wafer are stationary, and the wafer steps in succession, for example.

The invention is also applicable to a proximity photolithography system, wherein a mask and a wafer are closely located, and exposure of the mask pattern is performed without a projection system.

Furthermore, application of the photolithography system is not limited to a photolithography system for semiconductor manufacturing. The system has many uses such as an LCD photolithography system for exposing LCD device patterns onto a rectangular glass plate or a photolithography system for manufacturing a thin film magnetic head, for example.

In terms of the light source for the photolithography system, not only the g-line (436 rim), i-line (365 am), KrF excimer laser (248 nm), ArF excimer laser (193 nm), F2 laser (157 nm), and X-ray, but also charged particle beams such as the electron beam may be used. In the case of an electron beam, thermionic emission type lanthanum hexaboride ($LaB_6$) or tantalum (Ta) may be used as an electron gun.

Reaction force generated by wafer stage motion may be mechanically released to the floor (ground) using a frame member as described in U.S. Pat. No. 5,528,118 (JP Hei 8-166475).

Reaction force generated by reticle stage motion may be released to the floor (ground) using a frame member as described in U.S. patent application Ser. No. 08/416,558 (JPHei 8-330224).

As described above, the photolithography system of the present invention can be built by assembling various subsystems, including the elements listed in the claims, in the manner that prescribed mechanical accuracy, electrical accuracy and optical accuracy are maintained.

Examples of the subsystems are the illumination system, optical system (irradiation system), reticle stage, and wafer stage.

In order to maintain accuracy of various subsystems, every optical system is adjusted to achieve its optical accuracy, every mechanical system is adjusted to achieve its mechanical accuracy, and every electrical system is adjusted to achieve its electrical accuracy before and after its assembly. The process of assembling each subsystem into a photolithography system includes mechanical interface, electrical circuits' wiring connections, and air pressure plumbing connections. Each subsystem may be assembled prior to assembling the photolithography system from various subsystems. Once the photolithography system is assembled with various subsystems, total adjustment is performed so as to make sure that every accuracy is maintained in a complete system. It is desirable to manufacture a photolithography system in a clean room where the temperature and cleanliness are controlled, as is well known by those skilled in the art.

When the present invention is applied to manufacturing a semiconductor device, such device is fabricated by going through the following steps, for example: design of the device's function and performance; reticle design according to the previous design step; manufacturing of the wafer from a silicon material; exposure of a reticle pattern on a wafer by the photolithography system; assembly of the device (including a dicing process, bonding process and packaging process); and inspection and testing of the semiconductor device.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. An electric motor comprising:
   a first portion having a first magnet array and a first coil array having a plurality of coils disposed in a plane in a two dimensional array and positioned adjacent to the first magnet array, the first coil array being operable to interact with magnetic fields of the first magnet array to move a member;
   a second portion having a second magnet array and a second coil array having a plurality of linear coil arrays positioned adjacent to the second magnet array and operable to interact with magnetic fields of the second magnet array to move said member;
   the first motor portion and the second motor portion being generally parallel to one another and configured for receiving said member therebetween.

2. The electric motor of claim 1 wherein the first magnet array comprises a plurality of magnets disposed in a plane in a two dimensional array.

3. The electric motor of claim 2 wherein said plurality of magnets are arranged in wedge magnet sets, each set having a resultant magnetic polarization substantially perpendicular to said plane.

4. The electric motor of claim 3 wherein each wedge magnet set comprises at least two wedge magnets having a magnetic polarity oriented at an angle relative to said plane.

5. The electric motor of claim 3 further comprising a plurality of transverse magnets each having a polarity oriented parallel to said plane, at least one transverse magnet being disposed between adjacent wedge magnet sets.

6. The electric motor of claim 1 wherein each of said plurality of coils of the first coil array has a toroidal shape.

7. The electric motor of claim 1 wherein the first coil array is operable to interact with the magnetic fields of the first magnet array to provide a force between the first coil array and the first magnet array in at least two directions.

8. The electric motor of claim 1 wherein the second coil array is operable to interact with the magnetic fields of the second magnet array to provide a force between the second coil array and the second magnet array in at least one direction.

9. The electric motor of claim 8 wherein the second magnet array and the second coil array are operable to interact to provide a torque between the second magnet array and the second coil array about said at least one direction.

10. The electric motor of claim 1 wherein the second magnet array comprises a plurality of linear magnet arrays having at least one transverse magnet with a magnetic polarity oriented substantially parallel to a plane and at least one wedge magnet having a magnetic polarity oriented at an angle to said plane.

11. The electric motor of claim 10 wherein the magnetic polarity of the wedge magnet is oriented at an angle greater than zero degrees and less than ninety degrees.

12. The electric motor of claim 10 wherein said at least one transverse magnet comprises a plurality of transverse magnets and said at least one wedge magnet comprises a plurality of wedge magnets, the transverse magnets being interposed between two wedge magnets.

13. The electric motor of claim 1 wherein the plurality of linear coil arrays comprises a first linear coil array having polygonal shaped coils extending longitudinally in a first direction and a second linear coil array having polygonal shaped coils extending longitudinally in a second direction generally orthogonal to said first direction.

14. The electric motor of claim 13 wherein said polygonal shape is hexagonal.

15. A positioning device comprising:
    a frame;
    a member movable relative to the frame, the member having a first surface and a second surface generally parallel to the first surface; and
    an electric motor comprising a first motor portion having a first magnet array and a first coil array, and a second motor portion having a second magnet array and a second coil array, the first coil array having a plurality of coils disposed in a plane in a two dimensional array and the second coil array having a plurality of linear coil arrays;
    the member being interposed between the first motor portion and the second motor portion with the first coil array being positioned adjacent to the first magnet array to interact with magnetic fields of the first magnet array, and the second coil array being positioned adjacent to the second magnet array to interact with magnetic fields of the second magnet array to move the member relative to the first and second coil arrays.

16. The positioning device of claim 15 wherein the first magnet array comprises a plurality of magnets disposed in a plane in a two dimensional array.

17. The positioning device of claim 16 wherein said plurality of magnets are arranged in wedge magnet sets, each set having a resultant magnetic polarization substantially perpendicular to said plane.

18. The positioning device of claim 17 wherein each of the wedge magnet sets comprises at least two wedge magnets having a magnetic polarity oriented at an angle to said plane.

19. The positioning device of claim 17 further comprising a plurality of transverse magnets each having a magnetic polarity oriented parallel to said plane, at least one transverse magnet being disposed between adjacent wedge magnet sets.

20. The positioning device of claim 15 wherein the first coil array is operable to interact with the magnetic fields of the first magnet array to provide a force between the first coil array and the first magnet array in at least two directions.

21. The positioning device of claim 15 wherein the second coil array is operable to interact with the magnetic fields of the second magnet array to provide a force between the second coil array and the second magnet array in at least one direction.

22. The positioning device of claim 21 wherein the second magnet array and the second coil array are further operable to interact to provide a torque between the second magnet array and the second coil array about said at least one direction.

23. The positioning device of claim 15 wherein the second magnet array comprises a plurality of linear magnet arrays.

24. The positioning device of claim 23 wherein each of the linear magnet arrays comprises at least one transverse magnet having a magnetic polarity oriented substantially parallel to a plane and at least one wedge magnet having a magnetic polarity oriented at an angle to said plane.

25. The positioning device of claim 15 wherein said plurality of linear coil arrays comprises a first linear coil array having polygonal shaped coils extending longitudinally in a first direction and a second linear coil array having polygonal shaped coils extending longitudinally in a second direction generally orthogonal to said first direction.

26. An exposure apparatus comprising:
an irradiation system for irradiating an article with radiation to form a pattern on the article, the irradiation system comprising:
a frame; and
a stage device for positioning the article relative to the irradiation system, the stage device comprising:
a stage movable relative to the irradiation system and having a lower surface and an upper surface adapted to support the article; and
a first motor portion comprising a first magnet array and a first coil array having a plurality of coils disposed in a plane in a two dimensional array, and a second motor portion comprising a second magnet array and a second coil array having a plurality of linear coil arrays;
the stage being interposed between the first motor portion and the second motor portion with the first coil array being positioned adjacent to the first magnet array to interact with magnetic fields of the first magnet array and the second coil array being positioned adjacent to the second magnet array to interact with magnetic fields of the second magnet array to move the stage.

27. The exposure apparatus of claim 26 wherein the first magnet array comprises a plurality of magnets disposed in a plane in a two dimensional array.

28. The exposure apparatus of claim 27 wherein a portion of said plurality of magnets are arranged in wedge magnet sets, each set having a resultant magnetic polarization substantially perpendicular to said plane.

29. The exposure apparatus of claim 28 wherein each of the wedge magnet sets comprises at least two wedge magnets having a magnetic polarity oriented at an angle relative to said plane.

30. The exposure apparatus of claim 29 further comprising a plurality of transverse magnets each having a magnetic polarity oriented parallel to said plane, at least one transverse magnet being disposed between adjacent wedge magnet sets.

31. The exposure apparatus of claim 26 wherein the first coil array is operable to interact with the magnetic fields of the first magnet array to provide a force between the first coil array and the first magnet array in at least two directions.

32. The exposure apparatus of claim 26 wherein the second coil array is operable to interact with the magnetic fields of the second magnet array to provide a force between the second coil array and the second magnet array in at least one direction.

33. The exposure apparatus of claim 32 wherein the second magnet array and the second coil array are further operable to interact to provide a torque between the second magnet array and the second coil array about said at least one direction.

34. The exposure apparatus of claim 26 wherein the second magnet array comprises a plurality of linear magnet arrays.

35. The exposure apparatus of claim 34 further comprising a chuck mounted on the upper surface of the stage for holding the article, the linear magnet arrays being arranged to surround the chuck.

36. The exposure apparatus of claim 34 wherein each of the linear magnet arrays comprises at least one transverse magnet having a magnetic polarity oriented substantially parallel to a plane and at least one wedge magnet having a magnetic polarity oriented at an angle to said plane.

37. The exposure apparatus of claim 26 wherein said plurality of linear coil arrays comprises a first linear coil array having polygonal shaped coils extending longitudinally in a first direction and a second linear coil array having polygonal shaped coils extending longitudinally in a second direction generally orthogonal to said first direction.

38. The exposure apparatus of claim 37 wherein the first and second linear coil arrays are arranged to form an opening in the second coil array to allow direct communication between the irradiation system and the article.

39. The exposure apparatus of claim 26 wherein the first and second coil arrays are attached to the frame, and the first and second magnet arrays are attached to the stage and movable relative to the first and second coil arrays.

40. A method of positioning an object comprising:
providing a first motor portion having a first magnet array and a first coil array having a plurality of coils disposed in a plane in a two dimensional array;
providing a second motor portion having a second magnet array and a second coil array having a plurality of linear coil arrays;
providing a member;
attaching one of the second magnet array and the second coil array to the member;
applying one or more currents to one or more coils of the first coil array to interact with magnetic fields of the first magnet array to generate a force between the first coil array and the first magnet array, and to one or more coils of the second coil array to interact with magnetic fields of the second magnet array to generate a force between the second coil array and the second magnet array to move the object.

41. The method of claim 40 wherein the member has an upper surface for supporting the object and a lower surface, and further comprising attaching the first magnet array to one of the surfaces of the member and attaching the second magnet array to the other of the surfaces of the member.

42. The method of claim 40 wherein applying one or more currents to generate a force between the first coil array and the first magnet array comprises generating a force in two directions in a plane.

43. The method of claim 40 wherein applying one or more currents to generate a force between the second coil array and the second magnet array comprises generating a force in at least one direction.

44. The method of claim 43 wherein applying one or more currents to the second coil array further comprises generating a torque between the second coil array and the second magnet array about said at least one direction.

45. The method of claim 40 wherein providing a first motor comprises providing a planar two-dimensional magnet array.

46. The method of claim 40 wherein providing a second motor comprises providing two linear coil arrays extending generally orthogonal to one another and two linear magnet arrays extending generally orthogonal to one another.

* * * * *